United States Patent
Lin et al.

(10) Patent No.: US 8,330,270 B1
(45) Date of Patent: Dec. 11, 2012

(54) INTEGRATED CIRCUIT PACKAGE HAVING A PLURALITY OF SPACED APART PAD PORTIONS

(75) Inventors: Geraldine Tsui Yee Lin, Hong Kong (HK); Walter de Munnik, Arnhem (NL); Kin Pui Kwan, Lai King (HK); Wing Him Lau, Yuen Long (HK); Kwok Cheung Tsang, Fanling (HK); Chun Ho Fan, Sam Tseng (HK); Neil McLellan, Danville, CA (US)

(73) Assignee: UTAC Hong Kong Limited, Tsuen Wan, New Territories (HK)

( * ) Notice: Subject to any disclaimer, the term of this patent is extended or adjusted under 35 U.S.C. 154(b) by 373 days.

(21) Appl. No.: 11/008,593

(22) Filed: Dec. 9, 2004

Related U.S. Application Data

(60) Continuation-in-part of application No. 10/318,262, filed on Dec. 13, 2002, now Pat. No. 6,872,661, which is a division of application No. 09/802,679, filed on Mar. 9, 2001, now Pat. No. 6,635,957, which is a continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.
*H01L 23/495* (2006.01)
*H01L 23/04* (2006.01)
*H01L 23/34* (2006.01)

(52) U.S. Cl. ........ 257/723; 257/684; 257/796; 257/784; 257/786; 257/666; 257/675; 257/676; 257/773; 257/774; 257/690; 257/696; 257/698

(58) Field of Classification Search .................. 257/723, 257/684, 796, 784, 786, 666, 675, 676, 773, 257/774, 690, 696, 698
See application file for complete search history.

(56) References Cited

U.S. PATENT DOCUMENTS

| 4,530,152 A | 7/1985 | Roche et al. |
| 4,685,998 A | 8/1987 | Quinn et al. |

(Continued)

FOREIGN PATENT DOCUMENTS

JP   59-208756   11/1984

(Continued)

OTHER PUBLICATIONS

U.S. Appl. No. 10/318,262, Kin Pui Kwan et al., "Leadless Plastic Chip Carrier With Etch Back Pad Singulation and Die Atach Pad Array", filed Dec. 13, 2002, currently pending.

(Continued)

*Primary Examiner* — A O Williams
(74) *Attorney, Agent, or Firm* — Mitchell M. Wong; The Exeter Law Group LLP

(57) ABSTRACT

An integrated circuit package having a selectively etched leadframe strip defining a die attach pad and a plurality of contact pads, at least one side of the die attach pad having a plurality of spaced apart pad portions; a semiconductor die mounted to the die attach pad and wires bonding the semiconductor die to respective ones of the contact pads; a first surface of the leadframe strip, including the semiconductor die and wire bonds, encapsulated in a molding material such that at least one surface of the leadframe strip is exposed, and wherein solder paste is disposed on said contact pads and said at least one side of said die attach pad.

15 Claims, 5 Drawing Sheets

U.S. PATENT DOCUMENTS

| | | | |
|---|---|---|---|
| 4,812,896 A | 3/1989 | Rothgery et al. | |
| 5,066,831 A | 11/1991 | Spielberger et al. | |
| 5,157,480 A | 10/1992 | MsShane et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,273,938 A | 12/1993 | Lin et al. | |
| 5,277,972 A | 1/1994 | Sakumoto et al. | |
| 5,279,029 A | 1/1994 | Burns | |
| 5,293,072 A | 3/1994 | Tsuji et al. | |
| 5,332,864 A | 7/1994 | Liang et al. | |
| 5,343,076 A | 8/1994 | Katayama et al. | |
| 5,406,124 A | 4/1995 | Morita et al. | |
| 5,424,576 A | 6/1995 | Djennas et al. | |
| 5,430,331 A * | 7/1995 | Hamzehdoost et al. | 257/796 |
| 5,444,301 A | 8/1995 | Song et al. | |
| 5,457,340 A | 10/1995 | Templeton, Jr. et al. | |
| 5,474,958 A | 12/1995 | Djennas et al. | |
| 5,483,099 A | 1/1996 | Natarajan et al. | |
| 5,521,432 A | 5/1996 | Tsuji et al. | |
| 5,596,231 A | 1/1997 | Combs | |
| 5,604,376 A | 2/1997 | Hamburgen et al. | |
| 5,608,267 A | 3/1997 | Mahulikar et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,646,831 A | 7/1997 | Manteghi | |
| 5,650,663 A | 7/1997 | Parthasarathi | |
| 5,656,550 A * | 8/1997 | Tsuji et al. | 438/123 |
| 5,683,806 A | 11/1997 | Sakumoto et al. | |
| 5,696,666 A | 12/1997 | Miles et al. | |
| 5,701,034 A | 12/1997 | Marrs | |
| 5,710,064 A | 1/1998 | Song et al. | |
| 5,710,695 A | 1/1998 | Manteghi | |
| 5,726,502 A | 3/1998 | Beddingfield | |
| 5,777,382 A | 7/1998 | Abbott et al. | |
| 5,847,455 A | 12/1998 | Manteghi | |
| 5,847,458 A * | 12/1998 | Nakamura et al. | 257/738 |
| 5,894,108 A | 4/1999 | Mostafazadeh et al. | |
| 5,900,676 A | 5/1999 | Kweon et al. | |
| 5,969,426 A | 10/1999 | Baba et al. | |
| 5,976,912 A | 11/1999 | Fukutomi et al. | |
| 6,001,671 A | 12/1999 | Fjelstad | |
| 6,025,640 A * | 2/2000 | Yagi et al. | 257/666 |
| 6,057,601 A | 5/2000 | Lau et al. | |
| 6,081,029 A | 6/2000 | Yamaguchi | |
| 6,093,584 A | 7/2000 | Fjelstad | |
| 6,124,637 A | 9/2000 | Freyman et al. | |
| 6,153,503 A | 11/2000 | Lin et al. | |
| 6,194,786 B1 | 2/2001 | Orcutt | |
| 6,197,615 B1 * | 3/2001 | Song et al. | 438/111 |
| 6,204,553 B1 * | 3/2001 | Liu et al. | 257/676 |
| 6,208,020 B1 * | 3/2001 | Minamio et al. | 257/684 |
| 6,229,200 B1 | 5/2001 | McLellan et al. | |
| 6,238,952 B1 | 5/2001 | Lin | |
| 6,294,100 B1 | 9/2001 | Fan et al. | |
| 6,294,830 B1 | 9/2001 | Fjelstad | |
| 6,306,685 B1 | 10/2001 | Liu et al. | |
| 6,372,539 B1 | 4/2002 | Bayan et al. | |
| 6,459,163 B1 | 10/2002 | Bai | |
| 6,476,469 B2 * | 11/2002 | Hung et al. | 257/676 |
| 6,489,557 B2 | 12/2002 | Eskildsen et al. | |
| 6,498,099 B1 | 12/2002 | McLellan et al. | |
| 6,528,877 B2 | 3/2003 | Ernst et al. | |
| 6,528,893 B2 | 3/2003 | Jung et al. | |
| 6,545,347 B2 | 4/2003 | McClellan | |
| 6,583,499 B2 * | 6/2003 | Huang et al. | 257/666 |
| 6,585,905 B1 | 7/2003 | Fan et al. | |
| 6,586,677 B2 | 7/2003 | Glenn | |
| 6,635,957 B2 | 10/2003 | Kwan et al. | |
| 6,762,118 B2 | 7/2004 | Liu et al. | |
| 6,777,788 B1 * | 8/2004 | Wan et al. | 257/670 |
| 6,812,552 B2 * | 11/2004 | Islam et al. | 257/666 |
| 6,821,821 B2 | 11/2004 | Fjelstad | |
| 6,861,734 B2 * | 3/2005 | Minamio et al. | 257/666 |
| 6,872,661 B1 | 3/2005 | Kwan et al. | |
| 6,879,034 B1 | 4/2005 | Yang et al. | |
| 6,907,658 B2 | 6/2005 | Li | |
| 6,909,168 B2 * | 6/2005 | Minamio et al. | 257/670 |
| 6,930,377 B1 * | 8/2005 | Bayan | 257/684 |
| 6,933,594 B2 | 8/2005 | McLellen et al. | |
| 6,964,918 B1 | 11/2005 | Fan et al. | |
| 6,989,294 B1 | 1/2006 | McLellen et al. | |
| 7,033,517 B1 * | 4/2006 | Fan et al. | 216/13 |
| 7,042,068 B2 * | 5/2006 | Ahn et al. | 257/666 |
| 7,042,071 B2 * | 5/2006 | Minamio et al. | 257/670 |
| 7,053,492 B2 * | 5/2006 | Takahashi et al. | 257/783 |
| 7,087,986 B1 * | 8/2006 | Bayan et al. | 257/676 |
| 7,149,088 B2 * | 12/2006 | Lin et al. | 361/704 |
| 7,169,651 B2 * | 1/2007 | Park et al. | 438/124 |
| 7,335,532 B2 * | 2/2008 | Noquil et al. | 438/108 |
| 7,378,299 B2 * | 5/2008 | Koh et al. | 438/123 |
| 7,397,129 B2 * | 7/2008 | Lee | 257/774 |
| 7,405,106 B2 * | 7/2008 | Maloney et al. | 438/111 |
| 7,410,834 B2 * | 8/2008 | Fukaya et al. | 438/123 |
| 2001/0009301 A1 * | 7/2001 | Azuma | 257/698 |
| 2002/0031869 A1 * | 3/2002 | Minamio et al. | 438/127 |
| 2002/0084518 A1 * | 7/2002 | Hasebe et al. | 257/676 |
| 2002/0133943 A1 | 9/2002 | Sakamoto et al. | |
| 2003/0001244 A1 * | 1/2003 | Araki et al. | 257/666 |
| 2003/0006055 A1 * | 1/2003 | Chien-Hung et al. | 174/52.1 |
| 2003/0015780 A1 | 1/2003 | Kang et al. | |
| 2005/0067712 A1 * | 3/2005 | Imaoka et al. | 257/774 |
| 2005/0167855 A1 * | 8/2005 | Minamio et al. | 257/787 |
| 2005/0224924 A1 * | 10/2005 | Koh et al. | 257/666 |
| 2005/0242417 A1 * | 11/2005 | Youn et al. | 257/676 |
| 2006/0151862 A1 * | 7/2006 | Lin et al. | 257/676 |
| 2006/0170081 A1 * | 8/2006 | Gerber et al. | 257/666 |
| 2007/0007634 A1 * | 1/2007 | Youn et al. | 257/676 |
| 2007/0273017 A1 * | 11/2007 | Maloney et al. | 257/690 |

FOREIGN PATENT DOCUMENTS

| | | | |
|---|---|---|---|
| JP | 2003031753 (A) | * | 1/2003 |
| WO | WO-0048249 A1 | * | 8/2000 |

OTHER PUBLICATIONS

U.S. Appl. No. 09/802,679, Kin Pui Kwan et al., "Leadless Plastic Chip Carrier With Etch Back Pad Singulation and Die Attach Pad Array", filed Mar. 9, 2001, now U.S. Patent No. 6,635,957.

U.S. Appl. No. 09/095,803, Neil McLellan et al., "Saw-singulated Leadless Plastic Chip Carrier", filed Jun. 10, 1998, now U.S. Patent No. 6,229,200.

U.S. Appl. No. 09/288,352, Neil McLellan et al., "Leadless Plastic Chip Carrier With Etch Back Pad Singulation", filed Apr. 9, 1999, now U.S. Patent No. 6,498,099.

* cited by examiner

INTEGRATED CIRCUIT PACKAGE HAVING A PLURALITY OF SPACED APART PAD PORTIONS

RELATED APPLICATIONS

This application is a continuation-in-part of U.S. patent application Ser. No. 10/318,262, filed Dec. 13, 2002, now U.S. Pat. No. 6,872,661, which is a divisional application of U.S. application Ser. No. 09/802,679, filed Mar. 9, 2001, now U.S. Pat. No. 6,635,957, which is a continuation-in-part of U.S. application Ser. No. 09/288,352, filed Apr. 8, 1999, now U.S. Pat. No. 6,498,099 which is a continuation-in-part of U.S. application Ser. No. 09/095,803, filed Jun. 10, 1998, now U.S. Pat. No. 6,229,200.

FIELD OF THE INVENTION

The present invention relates in general to integrated circuit packaging, and more particularly to an integrated circuit package with unique die attach pad features.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die attach pad (paddle) is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features of outer leads is eliminated and no outer leads are necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, issued May 8, 2001, the contents of which are incorporated herein by reference.

In use, the exposed die attach pad and contact pads of Applicant's previously developed LPCC are soldered to the motherboard. To facilitate soldering of the exposed die attach pad and the contact pads, solder paste is printed on the exposed surface of the die attach pad and on the contact pads. The solder paste is reflowed during connection of the package to the motherboard to thereby form a solder joint between the package and the motherboard. During reflow, surface tension of the solder paste on the large die attach pad causes reduced area of coverage of solder paste on the die attach pad and increased height of the solder paste between the die pad and the motherboard. This results in lifting of the package, weakening of the solder attachment between the die attach pad and the motherboard and in extreme cases, causes opening of the input/outputs or disconnection of the contact pads from the motherboard due to increased gap height between the package and the motherboard. Reflowing of solder printed on the surface of the die attach pad and the contact pads results in a solder bump height difference between the solder bump on the large die attach pad and the solder bumps on the smaller contact pads due to surface tension of the solder. Clearly this height difference is undesirable.

Further IC package improvements are desirable and are driven by industry demands for increased reliability, improved thermal and electrical performance and decreased size and cost of manufacture.

SUMMARY OF THE INVENTION

According to one aspect of the present invention, there is provided a process for fabricating an integrated circuit package including selectively etching a leadframe strip to define a die attach pad and a plurality of contact pads. At least one side of the die attach pad has a plurality of spaced apart pad portions. A semiconductor die is mounted to the die attach pad and wires are bonded from the semiconductor die to respective ones of the contact pads. A first surface of the leadframe strip, including the semiconductor die and wire bonds, is encapsulated in a molding material such that at least one surface of the leadframe strip is exposed. The integrated circuit package is singulated from a remainder of the leadframe strip.

According to another aspect of the present invention, there is provided an integrated circuit package including a die attach pad. At least one side of the die attach pad has a plurality of spaced apart pad portions. The integrated circuit package also includes a plurality of contact pads circumscribing the die attach pad, a semiconductor die mounted to the die attach pad and a plurality of wire bonds connecting the semiconductor die to ones of the contact pads. A molding material encapsulates the semiconductor die, the wire bonds and at least a surface of each of the die attach pad and the contact pads, such that at least one surface of each of the contact pads and the die attach pad is exposed.

According to still another aspect of the present invention, there is provided a leadframe strip including a plurality of units, each of the units including a die attach pad, at least one side of the die attach pad having a plurality of spaced apart pad portions, and a plurality of contact pads circumscribing the die attach pad.

Advantageously, the side of the die attach pad that includes the plurality of spaced apart pad portions is in the form of an array that is exposed after encapsulation. This provides a number of small surfaces for attachment of the die attach pad to the motherboard. Thus, a number of spaced apart pad portions provide surfaces for solder attachment to the motherboard. Due to the small size of the spaced apart portions, and due to the discontinuity of the exposed side of the die attach pad, lifting of the package during solder reflow on the printed circuit board is reduced. Also, an array of pad portions is provided that improves self-alignment of the package during solder reflow on the printed circuit board. The individual pad portions are oriented to improve filling during molding and thereby inhibit the entrapment of air during molding.

BRIEF DESCRIPTION OF THE DRAWINGS

The present invention will be better understood with reference to the drawings and to the following description, in which.

DETAILED DESCRIPTION OF THE PREFERRED EMBODIMENTS

Figure 1A:
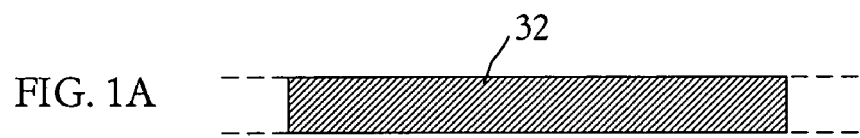
FIGS. 1A to 1J are sectional side views showing processing steps for fabricating integrated circuit packages according to one embodiment of the present invention.

Referring to the figures, a process for fabricating an integrated circuit package is described. The resulting integrated circuit package is indicated generally by the numeral 20. At least one side of the die attach pad 22 has a number of spaced apart pad portions 36. The integrated circuit package 20 also includes a plurality of contact pads 24 circumscribing the die attach pad 22, a semiconductor die 26 mounted to the die attach pad 22 and a plurality of wire bonds 28 connecting the semiconductor die 26 to ones of the contact pads 24. A molding material 30 encapsulates the semiconductor die 26, the wire bonds 28 and at least a surface of each of the die attach pad 22 and the contact pads 24, such that at least one surface of each of the contact pads 24 and the die attach pad 22 is exposed.

The process for fabricating the integrated circuit package 20 will now be described with particular reference to FIGS. 1A to 1J. For ease of illustration, the Figures show the fabrication of a single integrated circuit package 20. It will be understood, however, that the integrated circuit package 20 is gang fabricated and then singulated by sawing or punching.

With reference to FIG. 1A, there is shown a sectional side view of a copper (Cu) panel substrate which forms the raw material of the leadframe strip 32. As described below, the copper panel substrate is subjected to a selective wet etch process. As discussed in detail in Applicant's U.S. Pat. No. 6,229,200, the contents of which are incorporated herein by reference, the resulting leadframe strip 32 is divided into a plurality of sections, each of which incorporates a plurality of leadframe units in an array (e.g., 3×3 array, 5×5 array, etc.). Only one such unit is depicted in the Figures. Adjacent units being indicated by stippled lines. It will be appreciated that the adjacent units of the leadframe strip 32 are similar to the unit depicted and described herein. Reference is made to a single unit throughout the following description for the purpose of simplicity. As indicated above, the process described is carried out in the fabrication of several units in the array.

Figure 1B:
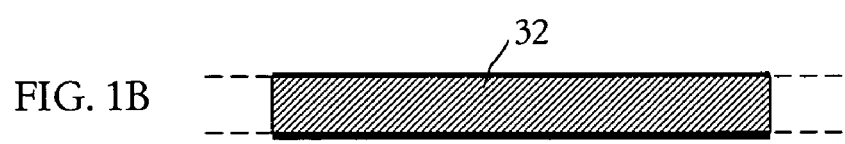
Figure 1C:

Referring to FIG. 1B, the raw material of the leadframe strip 32 is coated with a layer of photo-imageable solder mask such as a photo-imageable epoxy by spin coating the solder mask.

Nest, the layer of photo-imageable etch-resist mask is imaged with a photo-tool. This is accomplished by exposure of the photo-imageable mask to ultraviolet light masked by the photo-tool and subsequent developing of the solder-mask to result in the configuration shown in FIG. 1C. The photo-imageable mask is thereby patterned to provide pits in which the upper and lower surfaces of the leadframe strip 32 are exposed. Thus, the leadframe strip 32 is selectively masked with the photo-imageable mask.

Figure 1D:
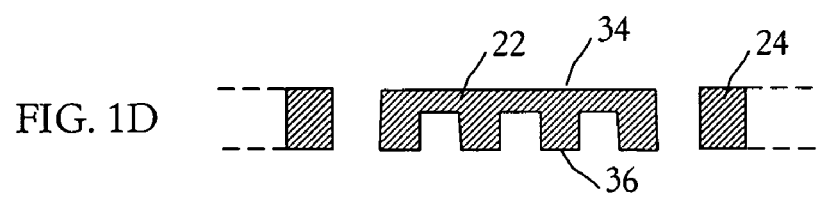

The leadframe strip 32 is then etched by, for example, immersion or pressurized spray etching and the photo-imageable mask is stripped away using conventional means (FIG. 1D). The resulting leadframe strip 32 includes a plurality of units, one of which is shown in the Figures. Each unit includes the generally centrally located die attach pad 22. The die attach pad 22 includes a continuous portion 34 on one side of the die attach pad 22 and the plurality of pad portions 36 that extend from the continuous portion 34, to the opposite side of the die attach pad 22. Each unit also includes the plurality of contact pads 24 that circumscribe the die attach pad 22.

Figure 2A:
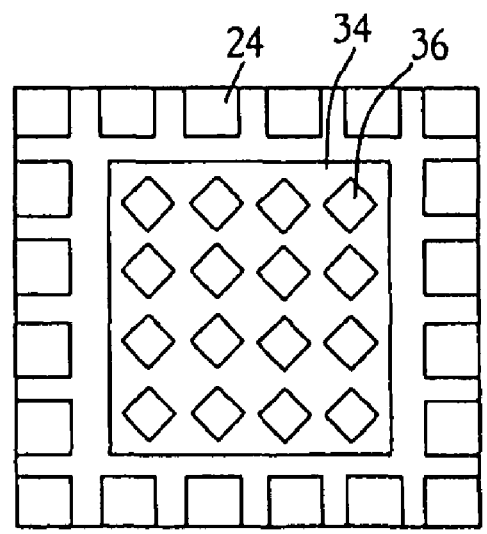
FIGS. 2A and 2B are bottom views of a single unit of a leadframe strip, showing processing steps for fabricating the integrated circuit package that correspond with FIGS. 1D, and 1H, respectively.

As best shown in FIGS. 1D and 2A, the pad portions 36 each have generally square cross-sections in the form of a regular array. The pad portions 36 are oriented such that the sides of the pad portions 36 are not parallel with the sides of the continuous portion 34 of the die attach pad 22. Thus, the sides of the pad portions 36 form an oblique angle with the sides of the continuous portion 34 o the die attach pad 22 (and the molding material that is further described below). In the present embodiment, the sides of the pad portions 36 generally form an angle of about forty-five degrees with the sides of the continuous portion 34 of the die attach pad 22. Thus, the array forms a diamond pattern with pad portions 36 oriented with corners of the pad portions 36 in the direction of the molding material flow (when molding). This aids in molding material flow under the continuous portion 34 of the die attach pad 22 and results in improved filling.

Figure 1E:
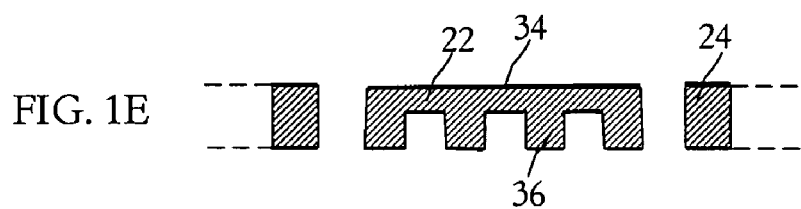

The leadframe strip 32 is then plated with, for example, silver (Ag) or nickel (Ni) and palladium (Pd) to facilitate wire bonding (FIG. 1E).

Figure 1F:
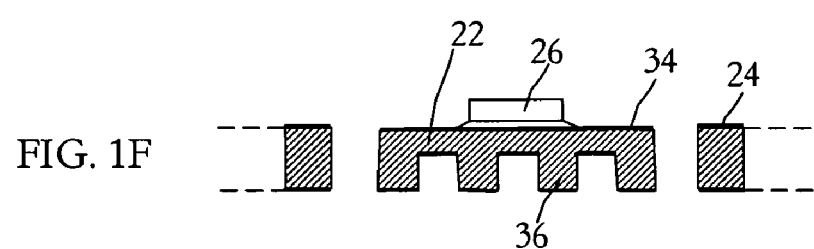
Figure 1G:
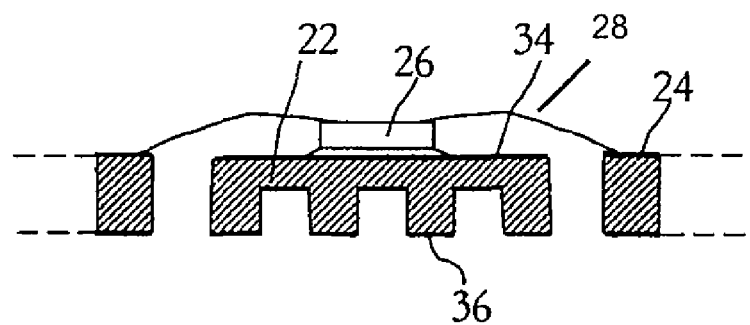

A singulated semiconductor die 26 is then mounted to the continuous portion 34 of the die attach pad 22 using, for example, epoxy (FIG. 1F). Gold wire bonds 28 are then bonded between bond pads of the semiconductor die 26 and the contact pads 24 (FIG. 1G).

Figure 1H:
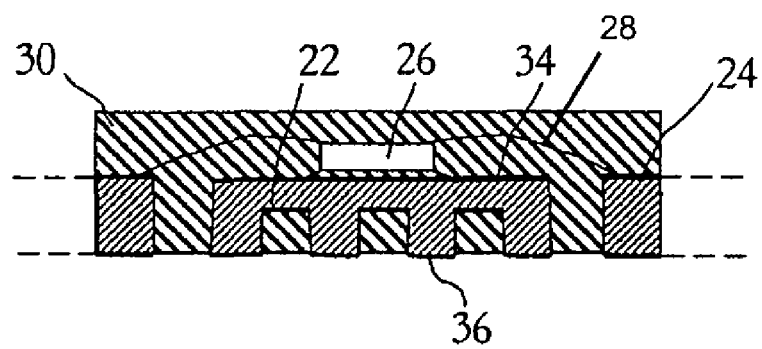
Figure 2B:
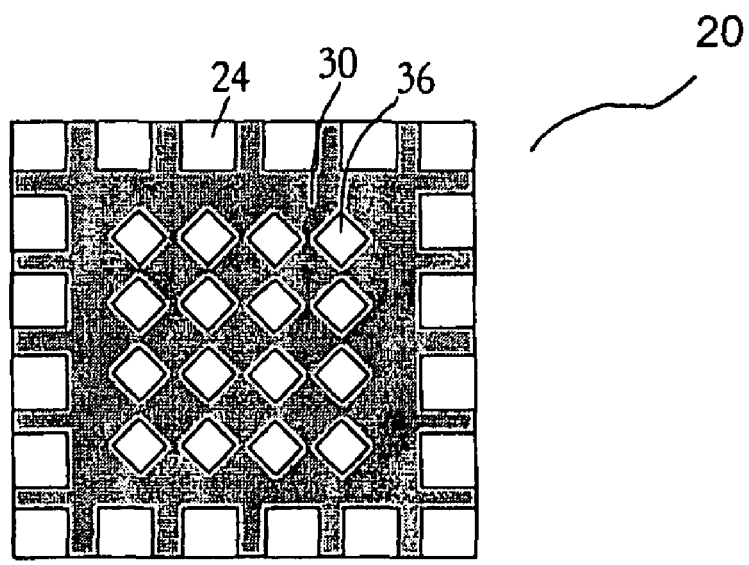

The leadframe strip 32 is then molded using a suitable mold, with the bottom cavity being a flat plate, followed by subsequent curing, as discussed in Applicant's U.S. Pat. No. 6,229,200, issued May 8, 2001 (FIGS. 1H and 2B). As indicated above, the pad portions 36 are oriented with corners of the pad portions 36 pointing in the direction of the molding material flow during molding to aid in the flow of molding material 30 around the pad portions 36 under the continuous portion 34 of the die attach pad 22. Clearly, the sides of the pad portions 36 are oriented at an oblique angle with the sides of the molding material 30 after molding.

The molding material 30 encapsulates the semiconductor die 26, the wire bonds 28, and all except one surface of the leadframe strip 32. In the orientation shown in FIG. 1H, a bottom surface of each of the contact pads 24 and a bottom surface of each of the pad portions 36 of the die attach pad 22 is exposed. FIG. 2B shows a bottom view of the integrated circuit package of FIG. 1H and best shows the exposed surfaces of the contact pads 24 and the pad portions 36.

Figure 1I:
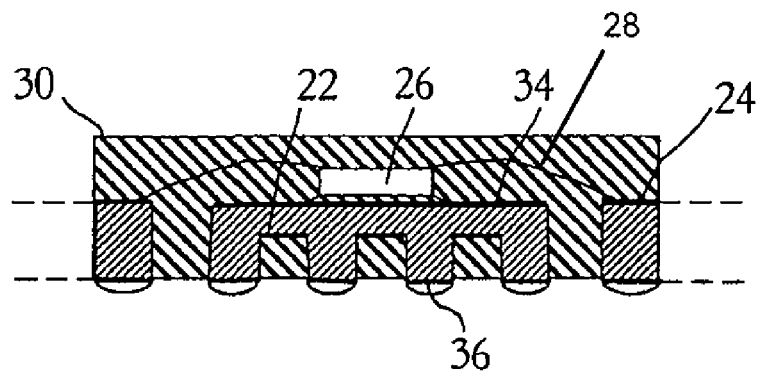

Next, solder paste is applied to the contact pads 24 and to the pad portions 36 by screen printing, as will be understood by those skilled in the art. After solder paste printing, the solder is reflowed using known reflow technique (FIG. 1I).

Figure 1J:
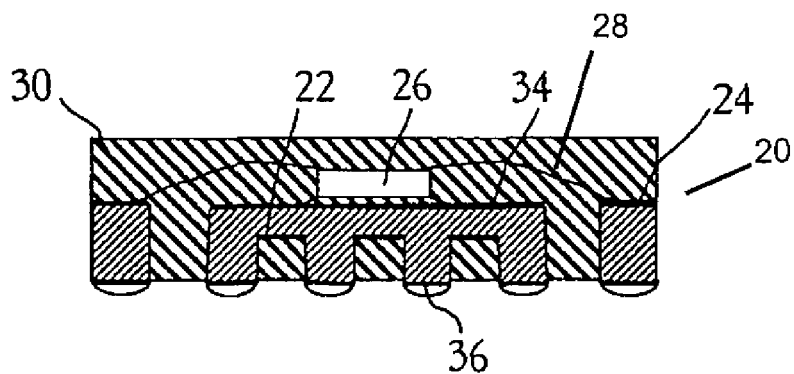

Singulation of the individual integrated circuit package 20 follows removal of the leadframe strip 32 from the mold, resulting in the integrated circuit package 20 as shown in FIG. 1J. Singulation is performed by, for example, saw singulation.

Figure 3A:
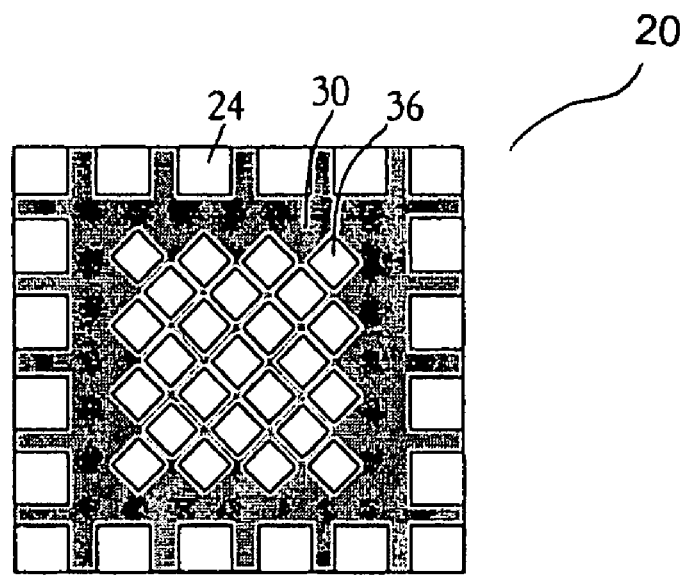
FIGS. 3A and 3B show bottom views of a single integrated circuit package according to alternative embodiments of the present invention.
Figure 3B:
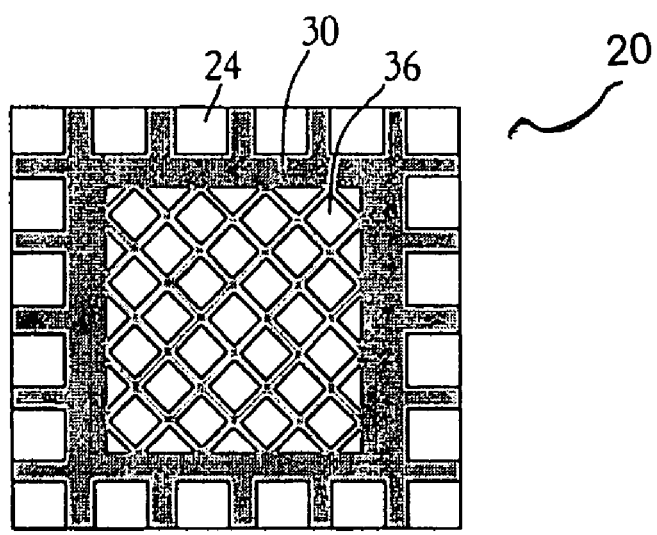

It will be appreciated that although a particular embodiment of the invention has been described and illustrated, various changes and modifications may occur to those skilled in the art. For example, rather than saw singulation, singulation may be performed by punching. Also, rather than the arrangement of the pad portions 36, shown in FIG. 2B, other arrangements are possible without departing from the scope of the present invention. Exemplary alternative arrangements are shown in FIGS. 3A and 3B.

Figure 4:
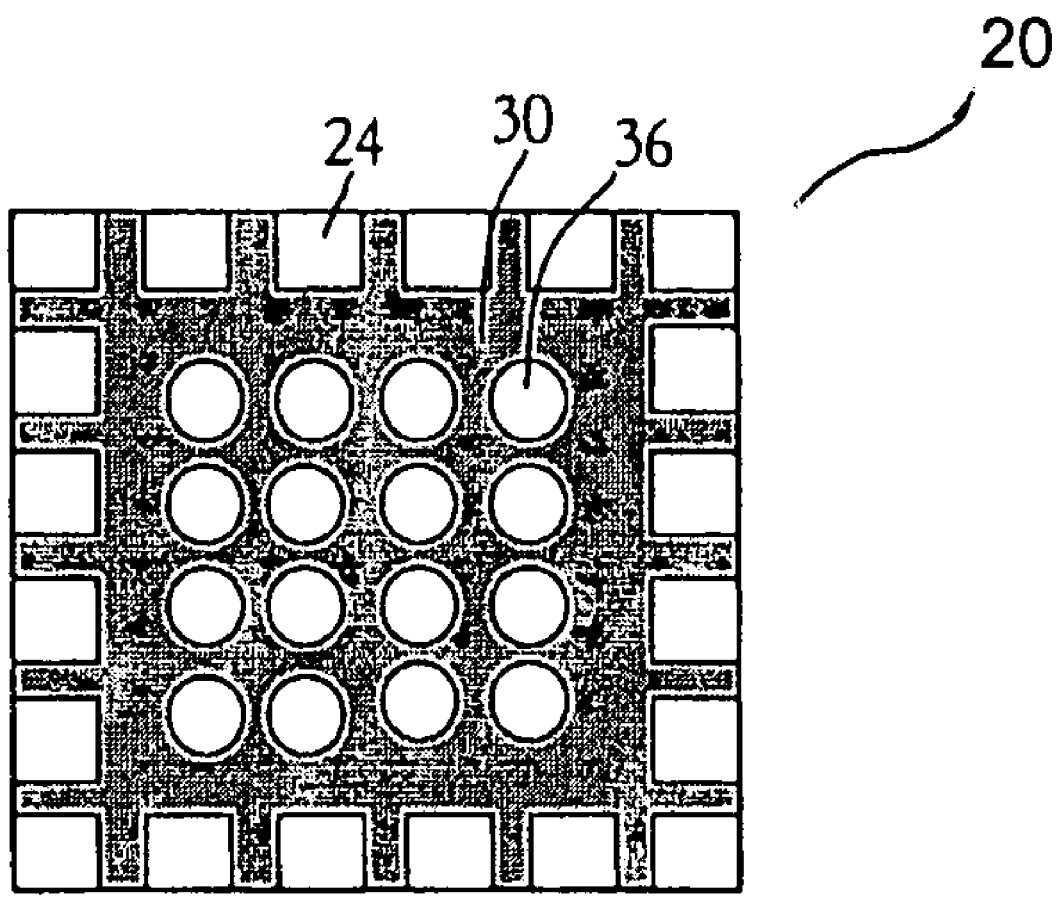
FIG. 4 shows a bottom view of a single integrated circuit package according to another embodiment of the present invention.

Reference is made to FIG. 4, which shows a bottom view of a single integrated circuit package according to another embodiment of the present invention. In this embodiment of the present invention, the pad portions 36 have generally circular cross-sections and are spaced in a regular array. Thus, the pad portions are rounded, thereby aiding in molding material flow under the continuous portion 34 of the die attach pad 22, resulting in improved filling. The remainder of the features of the integrated circuit package 20 according to the present embodiment and the process for fabricating the integrated circuit package 20 are similar to the features and process for the first-described embodiment, and therefore are not further described.

Still other variations and modifications may occur to those skilled in the art. All such changes and modifications may be made without departing from the sphere and scope of the present invention.

What is claimed is:

1. An integrated circuit package comprising:
   a die attach pad, continuous on one side of said die attach pad and having a plurality of spaced apart pad portions on a second side of the die attach pad opposite said first side;
   a plurality of contact pads circumscribing said die attach pad;
   a semiconductor die mounted to said die attach pad on said continuous one side;
   a plurality of wire bonds connecting said semiconductor die to ones of said contact pads;
   a molding material encapsulating said semiconductor die, said wire bonds and at least a surface of each of said die attach pad and said contact pads, such that at least one surface of each of said contact pads and said die attach pad is exposed; and
   solder paste disposed on said contact pads and said at least one side of said die attach pad.

2. The integrated circuit package according to claim 1, wherein said pad portions form an array.

3. The integrated circuit package according to claim 1 wherein ones of said pad portions have a generally square cross-section.

4. An integrated circuit package comprising:
   a die attach pad, continuous on one side of said die attach pad and having a plurality of spaced apart pad portions on a second side of the die attach pad opposite said first side;
   a plurality of contact pads circumscribing said die attach pad;
   a semiconductor die mounted to said die attach pad on said continuous one side;
   a plurality of wire bonds connecting said semiconductor die to ones of said contact pads;
   a molding material encapsulating said semiconductor die, said wire bonds and at least a surface of each of said die attach pad and said contact pads, such that at least one surface of each of said contact pads and said die attach pad is exposed; and
   solder paste disposed on said contact pads and said at least one side of said die attach pad,
   wherein ones of said pad portions have a generally circular cross-section.

5. An integrated circuit package comprising:
   a die attach pad, continuous on one side of said die attach pad and having a plurality of spaced apart pad portions on a second side of the die attach pad opposite said first side;
   a plurality of contact pads circumscribing said die attach pad;
   a semiconductor die mounted to said die attach pad on said continuous one side;
   a plurality of wire bonds connecting said semiconductor die to ones of said contact pads;
   a molding material encapsulating said semiconductor die, said wire bonds and at least a surface of each of said die attach pad and said contact pads, such that at least one surface of each of said contact pads and said die attach pad is exposed; and
   solder paste disposed on said contact pads and said at least one side of said die attach pad,
   wherein said pad portions form a diamond pattern such that sides of said pad portions form an oblique angle with sides of said molding material.

6. The integrated circuit package according to claim 1, wherein said pad portions form an array of similarly sized pad portions.

7. A leadframe strip comprising a plurality of units, each of said units comprising:
   a die attach pad, continuous on one side of said die attach pad, said continuous one side configured to have a semiconductor die mounted thereon, and having a plurality of spaced apart pad portions on a second side of the die attach pad opposite said first side; and
   a plurality of contact pads circumscribing said die attach pad; and
   solder paste disposed on said contact pads and said at least one side of said die attach pad.

8. The leadframe strip according to claim 7, wherein ones of said pad portions have a generally square cross-section.

9. The leadframe strip according to claim 7, wherein ones of said pad portions have a generally circular cross-section.

10. The leadframe strip according to claim 9, wherein said pad portions form a diamond pattern such that side of ones of said pad portions form an oblique angle with sides of said die attach pad at said die attach pad's said continuous one side.

11. The leadframe strip according to claim 10, wherein said pad portions form an array of similarly sized pad portions.

12. The leadframe strip according to claim 7, wherein ones of said plurality of pad portions have a generally square cross-section.

13. The leadframe strip according to claim 7, wherein ones of said plurality of pad portions have a generally circular cross-section.

14. The leadframe according to claim 12, wherein said pad portions are in a diamond pattern such that sides of said pad portions are at an oblique angle with sides of said die attach pad at said die attach pad's said continuous one side.

15. The integrated circuit package according to claim 1, wherein said pad portions form an array.

* * * * *